(12) United States Patent
Pei

(10) Patent No.: US 8,316,793 B2
(45) Date of Patent: Nov. 27, 2012

(54) FILM COATING APPARATUS

(75) Inventor: Shao-Kai Pei, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 423 days.

(21) Appl. No.: 12/632,945

(22) Filed: Dec. 8, 2009

(65) Prior Publication Data

US 2011/0000429 A1    Jan. 6, 2011

(30) Foreign Application Priority Data

Jul. 6, 2009    (CN) .......................... 2009 1 0304053

(51) Int. Cl.
B05C 13/02    (2006.01)
(52) U.S. Cl. .... 118/500; 118/719; 414/935; 414/222.01
(58) Field of Classification Search .................... 118/52, 118/56, 319, 320, 500, 719; 396/611; 414/935–940, 414/222.01; 427/240
See application file for complete search history.

(56) References Cited

U.S. PATENT DOCUMENTS

| | | | |
|---|---|---|---|
| 7,267,497 B2 * | 9/2007 | Akimoto et al. | 396/611 |
| 2003/0013318 A1 * | 1/2003 | Shiraishi et al. | 438/758 |
| 2006/0201615 A1 * | 9/2006 | Matsuoka et al. | 156/272.2 |
| 2007/0117400 A1 * | 5/2007 | Matsuoka et al. | 438/758 |

* cited by examiner

*Primary Examiner* — Laura Edwards
(74) *Attorney, Agent, or Firm* — Altis Law Group, Inc.

(57) ABSTRACT

A coating apparatus includes a housing, a number of coating chambers, a first lifting rod, a second lifting rod, and a third lifting rod. The housing includes a bottom wall with an opening defined thereon, a first side wall, and a second side wall opposite to the first side wall. The coating chambers are vertically aligned with each other and received in the housing. Each coating chamber defines an inlet and an outlet at two opposite sides thereof, two inlets of each two adjacent coating chambers faces the first side wall and the second side wall respectively. The first lifting rod and the second lifting rod are disposed adjacent to the second side wall and the first side wall respectively for moving a substrate among the coating chambers. The third lifting rod is disposed between the first lifting rod and the second lifting rod for carrying the substrate into and out of the housing through the opening.

14 Claims, 2 Drawing Sheets

FILM COATING APPARATUS

BACKGROUND

1. Technical Field

The present disclosure relates to film coating apparatuses and, particularly, to a film coating apparatus for coating multiple films on a substrate.

2. Description of Related Art

Typically, a coating apparatus only can coat one kind film on a substrate, in order to coat multiple films on a substrate, a number of coating apparatuses are needed. However, the number of coating apparatuses would take up a much big area for placing them.

What is needed, therefore, is a coating apparatus capable of coating multiple films on a substrate to overcome the above-described problem.

BRIEF DESCRIPTION OF THE DRAWINGS

Many aspects of the present coating apparatus can be better understood with reference to the accompanying drawings. The components in the drawings are not necessarily drawn to scale, the emphasis instead being placed upon clearly illustrating the principle of the present coating apparatus. In the drawings, all the views are schematic.

DETAILED DESCRIPTION

Embodiments of the present disclosure will now be described in detail below, with reference to the accompanying drawings.

Figure 1:
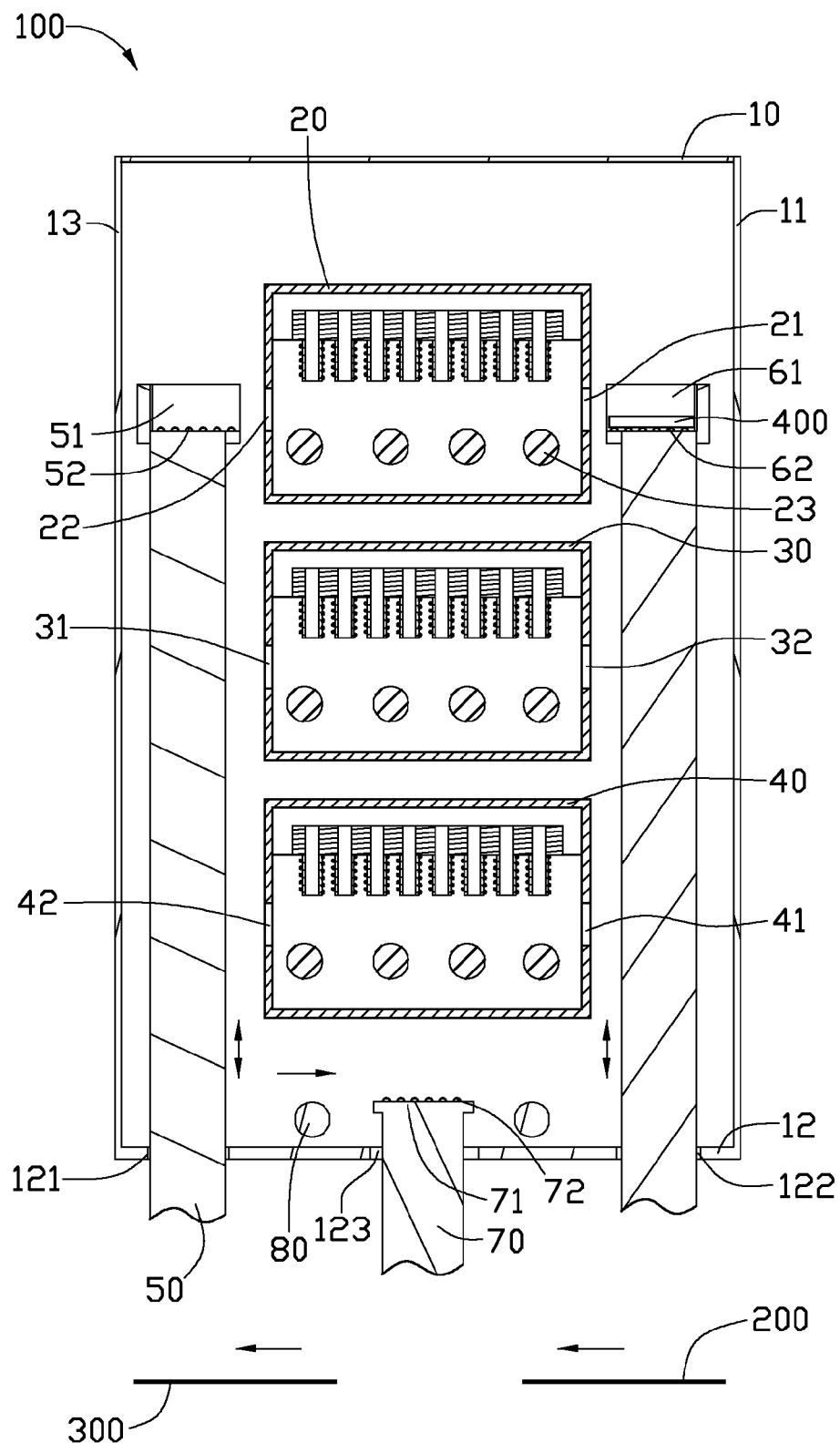
FIG. 1 is a schematic, sectional view of a coating apparatus according to an exemplary embodiment.

Referring to FIG. 1, a coating apparatus 100, a loading device 200, and an unloading device 300 according to an exemplary embodiment, are shown. The loading device 200 is configured for transmitting substrates 400 before being coated films thereon to the coating apparatus 100. The unloading device 300 is configured for taking away the substrates 400 after being coated films thereon. In the present embodiment, both of the loading device 200 and the unloading device 300 are band carriers.

The coating apparatus 100 includes a housing 10, a first coating chamber 20, a second coating chamber 30, a third coating chamber 40, a first lifting rod 50, a second lifting rod 60, and a third lifting rod 70.

The housing 10 includes a first side wall 11, a bottom wall 12, and a second side wall 13 opposite to the first side wall 11. The loading device 200 and the unloading device 300 are disposed under the bottom wall 12 of the housing 10. The bottom wall 12 defines a first opening 121 corresponding to the first lifting rod 50, a second opening 122 corresponding to the second lifting rod 60, and a third opening 123 corresponding to the third lifting rod 70.

The first coating chamber 20, the second coating chamber 30, and the third coating chamber 40 are vertically aligned with each other and received in the housing 10. Each of the first coating chamber 20, the second coating chamber 30, and the third coating chamber 40 can coat a type of film on the substrate 400. In the present embodiment, the first coating chamber 20, the second coating chamber 30, and the third coating chamber 40 can coat different films on the substrate 400, therefore, multiple films can be coated on the substrate 400. The first coating chamber 20 defines a first inlet 21 and a first outlet 22, the second coating chamber 30 defines a second inlet 31 and a second outlet 32, and the third coating chamber 40 defines a third inlet 41 and a third outlet 42. The first inlet 21, the second outlet 32, and the third inlet 41 face the first side wall 11 of the housing 10. The first outlet 22, the second inlet 31, and the third outlet 42 face the second side wall 13 of the housing 10. That is, two inlets of two adjacent coating chambers face the first side wall 11 and the second side wall 12 of the housing 10, respectively.

In the present embodiment, the first coating chamber 20 has a number of first transfer rollers 23. The first transfer rollers 23 can be used for holding the substrate 400 in the first coating chamber 20, and be used for transferring the substrate 400 from the first inlet 21 to the first outlet 22. The structure of the second coating chamber 30 and the third coating chamber 40 are same to that of the first coating chamber 20.

The first lifting rod 50 is disposed between the second side wall 13 of the housing 10 and the first coating chamber 20. The first lifting rod 50 is configured for carrying the substrate 400 among the first outlet 22, the second inlet 31, and the third outlet 42. The first lifting rod 50 runs through the first opening 121 of the bottom wall 12 of the housing 10, and is movable up and down in the housing 10. The first lifting rod 50 includes a first supporting portion 51 on the top end thereof. The first supporting portion 51 is used for holding the substrate 400 when the first lifting rod 50 moves up and down. The first supporting portion 51 of the first lifting rod 50 includes a number of second transfer rollers 52 capable of transferring the substrate 400 between the first supporting portion 51 and the first outlet 22, the second inlet 31, and the third outlet 42. It is understood that, if the first lifting rod 50 is extendable, the first opening 121 of the bottom wall 12 can be omitted.

The second lifting rod 60 is disposed between the first side wall 11 of the housing 10 and the first coating chamber 20. The second lifting rod 60 is configured for carrying the substrate 400 among the first inlet 21, the second outlet 32, and the third inlet 41. The second lifting rod 60 runs through the second opening 122 of the bottom wall 12 of the housing 10, and is movable up and down in the housing 10. The second lifting rod 60 includes a second supporting portion 61 on the top end thereof. The second supporting portion 61 is used for holding the substrate 400 when the second lifting rod 60 moves up and down. The second supporting portion 61 of the second lifting rod 60 includes a number of third transfer rollers 62 capable of transferring the substrate 400 between the second supporting portion 61 and the first inlet 21, the second outlet 32, and the third inlet 41. It is understood that, if the second lifting rod 60 is extendable, the second opening 122 of the bottom wall 12 can be omitted.

The third lifting rod 70 is disposed between the first lifting rod 50 and the second lifting rod 60. The third lifting rod 70 is configured for carrying the substrate 400 into the housing 10 from the loading device 200, and carrying the substrate 400 out of the housing 10 onto the unloading device 300. The third lifting rod 70 includes a loading surface 71 at the top end thereof, and a number of fourth transfer rollers 72 disposed on the loading surface 71 for transferring the substrate 400 among the first lifting rod 50, the second lifting rod 60, and the third lifting rod 70.

Because the distance between the first lifting rod 50 and the third lifting rod 70, and the distance between the second lifting rod 60 and the third lifting rod 70 are too big to transfer the substrate 400 therebetween, in the present embodiment, the coating apparatus 100 further includes a number of fifth transfer rollers 80 disposed between the first lifting rod 50 and the third lifting rod 70, and between the second lifting rod 60 and the third lifting rod 70. In other embodiment, if the distance between the first lifting rod 50 and the third lifting rod 70, and the distance between the second lifting rod 60 and the third lifting rod 70 are very small, the fifth transfer rollers 80 can be omitted. It is understood that, the first transfer rollers 23, the second transfer rollers 52, the third transfer rollers 62, the fourth transfer rollers 72, and the fifth transfer rollers 80 can also be other transfer device, such as band carriers etc.

Figure 2:
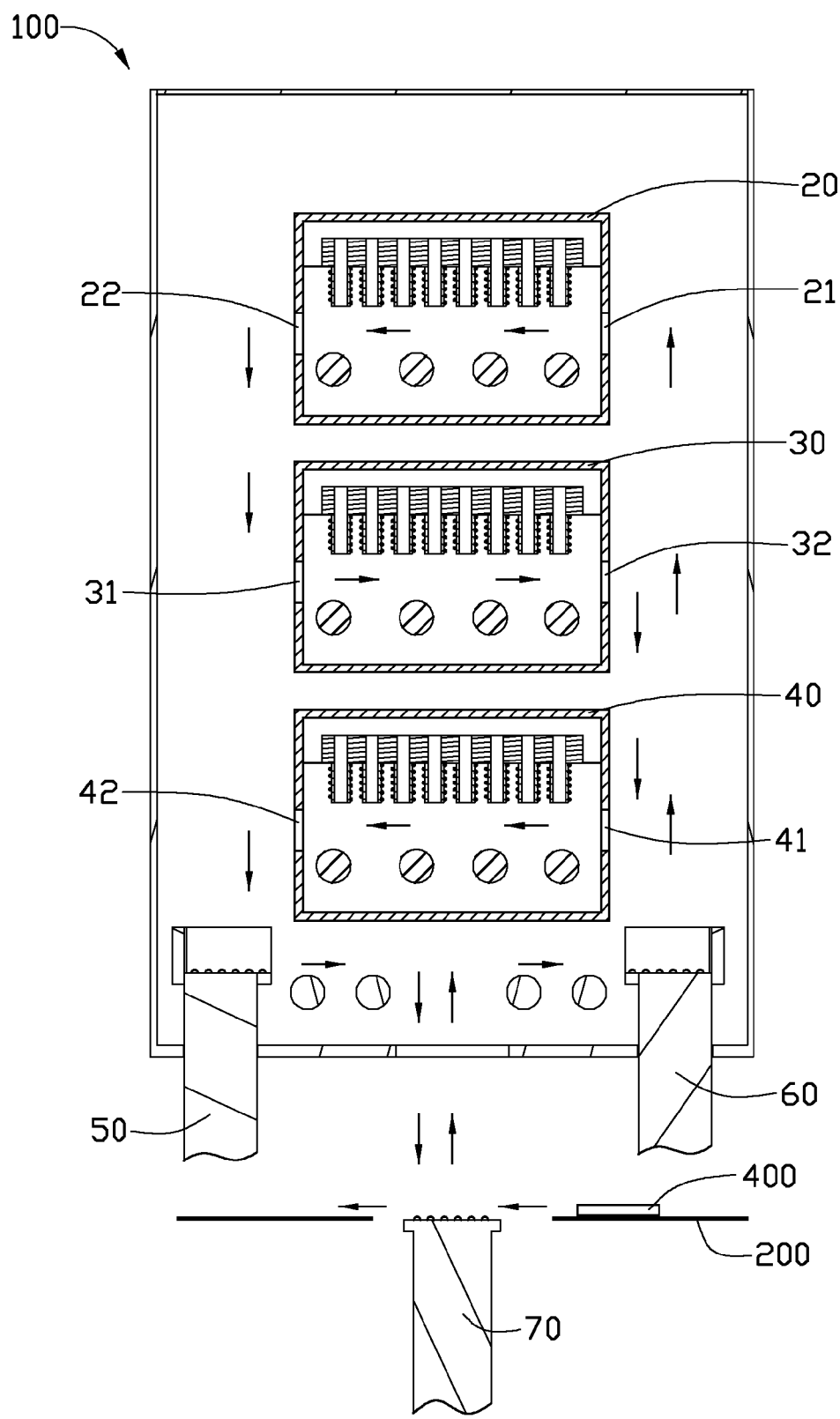
FIG. 2 shows a transfer route of a substrate during coating the substrate.

FIG. 2 shows a transfer route of the substrate 400 during coating the substrate 400 using the coating apparatus 100. The substrate 400 will first be transferred from the loading device 200 into the coating apparatus 100 by the third lifting rod 70, then the substrate 400 will be transferred into the first coating chamber 20 by the second lifting rod 60. After the substrate 400 being coated in the first coating chamber 20, the first lifting rod 50 will transfer the substrate 400 from the first outlet 22 of the first coating chamber 20 to the second inlet 31 of the second coating chamber 30. After the substrate 400 being coated in the second coating chamber 30, the second lifting rod 60 will transfer the substrate 400 from the second outlet 32 of the second coating chamber 30 to the third inlet 41 of the third coating chamber 40. And after the substrate 400 being coated in the third coating chamber 40, the first lifting rod 50 will transfer the substrate 400 from the third outlet 42 of the third coating chamber 40 out of the coating apparatus 100 by the first lifting rod 50 and the third lifting rod 70.

While certain embodiments have been described and exemplified above, various other embodiments will be apparent to those skilled in the art from the foregoing disclosure. The invention is not limited to the particular embodiments described and exemplified, and the embodiments are capable of considerable variation and modification without departure from the scope and spirit of the appended claims.

What is claimed is:

1. A coating apparatus for coating films on a substrate comprising:
    a housing comprising a bottom wall, a first side wall, and a second side wall opposite to the first side wall, the bottom wall defining an opening;
    a plurality of coating chambers vertically aligned with each other and received in the housing for forming different film coatings, each coating chamber defining an inlet and an outlet at two opposite sides thereof, two inlets of each two adjacent coating chambers facing the first side wall and the second side wall of the housing respectively;
    a first lifting rod disposed between the plurality of coating chambers and the second side wall of the housing, the first lifting rod being capable of carrying the substrate to each of the coating chambers;
    a second lifting rod disposed between the plurality of coating chambers and the first side wall of the housing, the second lifting rod being capable of carrying the substrate to each of the coating chambers; and
    a third lifting rod disposed between the first lifting rod and the second lifting rod for carrying the substrate into and out of the housing through the opening;
    wherein the first lifting rod comprises a first supporting portion on a top end thereof for holding the substrate when the first lifting rod carrying the substrate up and down, the first supporting portion of the first lifting rod comprises a plurality of rod transfer rollers.

2. The coating apparatus of claim 1, wherein the bottom wall of the housing further defines two openings corresponding to the first lifting rod and the second lifting rod respectively.

3. The coating apparatus of claim 1, wherein each of the plurality of coating chambers comprises a plurality of chamber transfer rollers for transferring the substrate from the inlet to the outlet of the corresponding coating chamber.

4. The coating apparatus of claim 1, wherein the second lifting rod comprises a second supporting portion on the top end thereof for holding the substrate when the second lifting rod carrying the substrate up and down.

5. The coating apparatus of claim 4, wherein the second supporting portion of the second lifting rod comprises a plurality of rod transfer rollers.

6. The coating apparatus of claim 1, wherein the first lifting rod and the second lifting rod are extendable.

7. The coating apparatus of claim 1, wherein the third lifting rod comprises a loading surface at the top end thereof, and a plurality of loading transfer rollers disposed on the loading surface.

8. The coating apparatus of claim 1, further comprising a plurality of transfer rollers disposed between the first lifting rod and the third lifting rod, and between the second lifting rod and the third lifting rod.

9. A coating apparatus for coating films on a substrate comprising:
    a housing comprising a bottom wall, a first side wall, and a second side wall opposite to the first side wall, the bottom wall defining an opening;
    a plurality of coating chambers arranged one on another in the housing for consecutively forming different film coatings on a substrate, each coating chamber defining an inlet and an outlet at two opposite sides thereof, two inlets of each two adjacent coating chambers facing the first side wall and the second side wall of the housing respectively;
    a first lifting rod disposed between the plurality of coating chambers and the second side wall of the housing, the first lifting rod being capable of moving the substrate among the plurality of coating chambers;
    a second lifting rod disposed between the plurality of coating chambers and the first side wall of the housing, the second lifting rod being capable of moving the substrate among the plurality of coating chambers; and
    a transfer device for carrying the substrate into and out of the housing through the opening, the transfer device being capable of transferring the substrate between the first lifting rod and the transfer device, and between the second lifting rod and the transfer device;
    wherein the first lifting rod comprises a first supporting portion on a top end thereof for holding the substrate when the first lifting rod carrying the substrate up and down, the first supporting portion of the first lifting rod comprises a plurality of rod transfer rollers.

10. The coating apparatus of claim 9, wherein the bottom wall of the housing further defines two openings corresponding to the first lifting rod and the second lifting rod respectively.

11. The coating apparatus of claim 9, wherein each of the plurality of coating chambers comprises a plurality of chamber transfer rollers used for transferring the substrate from the inlet to the outlet of the corresponding coating chamber.

12. The coating apparatus of claim 9, wherein the second lifting rod comprises a second supporting portion on the top end thereof for holding the substrate when the second lifting rod carrying the substrate up and down.

13. The coating apparatus of claim 12, wherein the second supporting portion of the second lifting rod comprises a plurality of rod transfer rollers.

14. The coating apparatus of claim 9, wherein the first lifting rod and the second lifting rod are extendable.

* * * * *